(12) United States Patent
Katsuno et al.

(10) Patent No.: US 7,615,794 B2
(45) Date of Patent: Nov. 10, 2009

(54) SEMICONDUCTOR LIGHT EMITTING DEVICE AND SEMICONDUCTOR LIGHT EMITTING APPARATUS

(75) Inventors: Hiroshi Katsuno, Kanagawa-ken (JP); Yasuo Ohba, Kanagawa-ken (JP); Kei Kaneko, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/195,718

(22) Filed: Aug. 21, 2008

(65) Prior Publication Data

US 2009/0050916 A1 Feb. 26, 2009

(30) Foreign Application Priority Data

Aug. 22, 2007 (JP) .............................. 2007-215596

(51) Int. Cl.
*H01L 29/22* (2006.01)
*H01L 29/207* (2006.01)
(52) U.S. Cl. .................... 257/93; 257/99; 257/E33.063; 257/E33.065
(58) Field of Classification Search .................... 257/93, 257/99, E33.063, E33.065
See application file for complete search history.

(56) References Cited

U.S. PATENT DOCUMENTS

| 2003/0006409 | A1 | 1/2003 | Ohba | |
|---|---|---|---|---|
| 2004/0155250 | A1 | 8/2004 | Ohba | |
| 2007/0034883 | A1 | 2/2007 | Ohba | |
| 2009/0078951 | A1* | 3/2009 | Miki et al. | 257/98 |
| 2009/0101923 | A1* | 4/2009 | Choi et al. | 257/89 |
| 2009/0114940 | A1* | 5/2009 | Yang et al. | 257/99 |

FOREIGN PATENT DOCUMENTS

| JP | 2003-168823 | 6/2003 |
|---|---|---|
| JP | 2006-41498 | 2/2006 |
| JP | 2006-245230 | 9/2006 |
| JP | 2006-245231 | 9/2006 |
| JP | 2006-245232 | 9/2006 |

OTHER PUBLICATIONS

Katsuno, H. et al., "Semiconductor Light Emitting Device and Method for Manufacturing Same," U.S. Appl. No. 12/195,580, filed Aug. 21, 2008.

* cited by examiner

*Primary Examiner*—Ngan Ngo
(74) *Attorney, Agent, or Firm*—Finnegan, Henderson, Farabow, Garrett & Dunner, L.L.P.

(57) ABSTRACT

A semiconductor light emitting device includes a first semiconductor layer, a second semiconductor layer, a light emitting layer provided between the first semiconductor layer and the second semiconductor layer, a first electrode provided on the first semiconductor layer, a second electrode including a first metal film provided on the second semiconductor layer and containing at least one of silver and a silver alloy, and a second metal film provided on the first metal film and made of a metal substantially not containing silver, and a dielectric film spaced from the first metal film on the second semiconductor layer. The second metal film covers the first metal film, at least part of the dielectric film, and a surface of the second semiconductor layer exposed between the first metal film and the dielectric film.

20 Claims, 10 Drawing Sheets

SEMICONDUCTOR LIGHT EMITTING DEVICE AND SEMICONDUCTOR LIGHT EMITTING APPARATUS

CROSS-REFERENCE TO RELATED APPLICATIONS

This application is based upon and claims the benefit of priority from the prior Japanese Patent Application No. 2007-215596, filed on Aug. 22, 2007; the entire contents of which are incorporated herein by reference.

BACKGROUND OF THE INVENTION

1. Field of the Invention

This invention relates to a semiconductor light emitting device including a silver-containing metal film and a semiconductor light emitting apparatus including this semiconductor light emitting device.

2. Background Art

A semiconductor light emitting device having a light emitting layer on a substrate or other semiconductor layer is often configured so that light emitted from the light emitting layer is extracted from the semiconductor layer side. For example, in a flip-chip semiconductor light emitting device, the light emitting layer side of the device is in contact with the heat sink side, and light is extracted from the substrate side. Thus, high light extraction efficiency is compatible with high heat dissipation. On the other hand, the electrode of a semiconductor light emitting device is sometimes made of silver or a silver alloy. Silver efficiently reflects the light emitted from the light emitting layer, and hence is suitable to realize a semiconductor light emitting device with high brightness.

However, silver is susceptible to migration, oxidation, and sulfidation, and may result in the decrease of emission intensity, lifetime, and breakdown voltage, and insulation failure. Migration is accelerated by exposure to moisture and impurity ions contained in ambient air, dielectric film, and the treatment liquid used during the device processing, and by electric field concentration during energization.

To solve this problem, there is a proposal for protecting a silver electrode by covering it with a metal other than silver or a protection film to prevent migration and reduce degradation (see, e.g., JP-A 2006-245231 (Kokai) and JP-A 2003-168823 (Kokai)).

SUMMARY OF THE INVENTION

According to an aspect of the invention, there is provided a semiconductor light emitting device including: a first semiconductor layer; a second semiconductor layer; a light emitting layer provided between the first semiconductor layer and the second semiconductor layer; a first electrode provided on the first semiconductor layer; a second electrode including a first metal film provided on the second semiconductor layer and containing at least one of silver and a silver alloy, and a second metal film provided on the first metal film and made of a metal substantially not containing silver; and a dielectric film spaced from the first metal film on the second semiconductor layer, the second metal film covering the first metal film, at least part of the dielectric film, and a surface of the second semiconductor layer exposed between the first metal film and the dielectric film.

According to another aspect of the invention, there is provided a semiconductor light emitting device including: a first semiconductor layer; a second semiconductor layer; a light emitting layer provided between the first semiconductor layer and the second semiconductor layer; a first electrode provided on the first semiconductor layer; a second electrode including a first metal film provided on the second semiconductor layer and containing at least one of silver and a silver alloy, and a second metal film provided on the first metal film and made of a metal substantially not containing silver; and a dielectric film spaced from the first metal film on the second semiconductor layer, the second metal film covering the first metal film, at least part of the dielectric film, and a surface of the second semiconductor layer exposed between the first metal film and the dielectric film, the dielectric film covering a side surface of a laminated body, the laminated body including the light emitting layer and the second semiconductor layer and being formed on a first major surface of the first semiconductor layer, and the side surface of the laminated body being oblique to the first major surface.

According to another aspect of the invention, there is provided a semiconductor light emitting apparatus including: a semiconductor light emitting device; and a phosphor configured to absorb light emitted from the semiconductor light emitting device and emit light with a different wavelength, the semiconductor light emitting device including: a first semiconductor layer; a second semiconductor layer; a light emitting layer provided between the first semiconductor layer and the second semiconductor layer; a first electrode provided on the first semiconductor layer; a second electrode including a first metal film provided on the second semiconductor layer and containing at least one of silver and a silver alloy, and a second metal film provided on the first metal film and made of a metal substantially not containing silver; and a dielectric film spaced from the first metal film on the second semiconductor layer, the second metal film covering the first metal film, at least part of the dielectric film, and a surface of the second semiconductor layer exposed between the first metal film and the dielectric film.

DETAILED DESCRIPTION OF THE INVENTION

Embodiments of the invention will now be described with reference to the drawings.

Figure 1A:
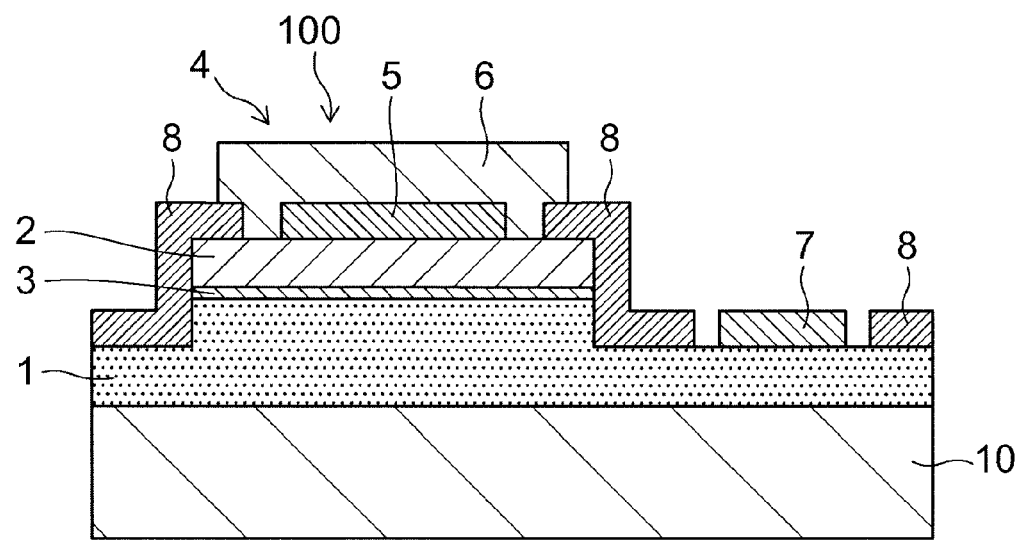
FIG. 1A is a schematic cross-sectional view showing the structure of a semiconductor light emitting device according to a first embodiment of the invention.
Figure 1B:
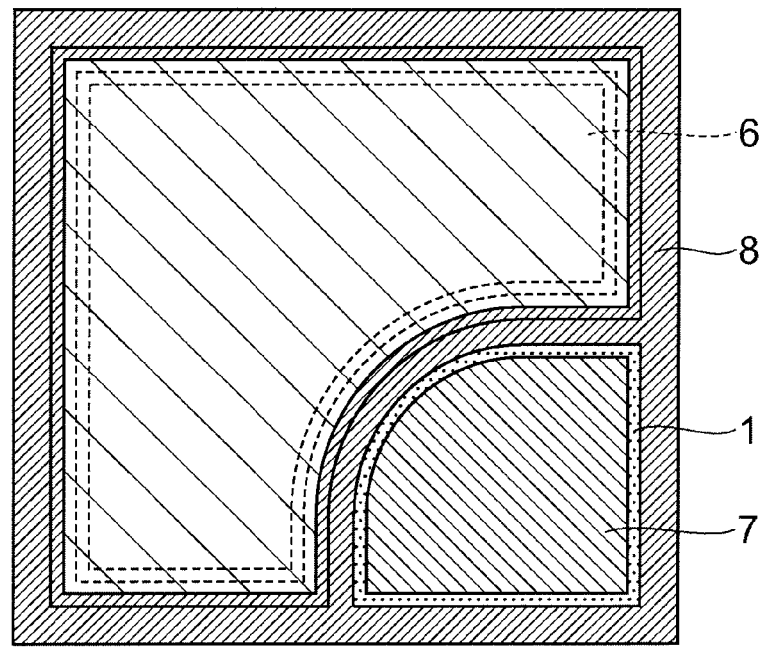
FIG. 1B is a schematic plan view thereof.

FIG. 1A is a schematic cross-sectional view showing the structure of a semiconductor light emitting device according to a first embodiment of the invention, and FIG. 1B is a schematic plan view thereof.

As shown in FIG. 1A, on a sapphire substrate 10, an n-type semiconductor layer (first semiconductor layer) 1, a light emitting layer 3, and a p-type semiconductor layer (second semiconductor layer) 2 are laminated in this order. On the p-type semiconductor layer 2 is provided a p-side electrode (second electrode) 4, which includes a first metal film 5 containing silver or a silver alloy and a second metal film 6 made of a metal not containing silver. The p-type semiconductor layer 2 is partly etched away, and on the exposed n-type semiconductor layer 1 is provided an n-side electrode 7. Except the n-side electrode 7, the first metal film 5, and the neighborhood thereof, the semiconductor layer is covered with a dielectric film 8. The p-type semiconductor layer 2 is exposed in a region between the first metal film 5 and the dielectric film 8. The second metal film 6 is in contact with the p-type semiconductor layer 2 in this exposed region and covers the first metal film 5 and a portion of the dielectric film 8 facing the first metal film 5.

In the example shown in FIG. 1B, the n-side electrode 7 occupies a corner of the semiconductor light emitting device, but the n-side electrode 7 is not limited thereto in shape and position.

Next, an example of the laminated structure of semiconductor layers is described.

The semiconductor light emitting device according to this embodiment is composed of nitride semiconductors formed on the sapphire substrate. More specifically, in an example structure, on the substrate 10 with the surface being the sapphire c-plane, metal organic chemical vapor deposition is used to sequentially laminate a first AlN buffer layer with high carbon concentration (with a carbon concentration of $3 \times 10^{18}$-$5 \times 10^{20}$ cm$^{-3}$) to a thickness of 3-20 nm, a second AlN buffer layer with high purity (with a carbon concentration of $1 \times 10^{16}$-$3 \times 10^{18}$ cm$^{-3}$) to 2 µm, a non-doped GaN buffer layer to 3 µm, a Si-doped n-type GaN contact layer (with a Si concentration of $1 \times 10^{18}$-$5 \times 10^{18}$ cm$^{-3}$) to 4 µm, a Si-doped n-type Al$_{0.10}$Ga$_{0.90}$N cladding layer (with a Si concentration of $1 \times 10^{18}$ cm$^{-3}$) to 0.02 µm, a light emitting layer of the multiple quantum well structure to 0.075 µm in which a Si-doped n-type Al$_{0.11}$Ga$_{0.89}$N barrier layer (with a Si concentration of 1.1-1.5$\times 10^{19}$ cm$^{-3}$) and a GaInN light emitting layer (with a wavelength of 380 nm) are alternately laminated three times, a final Al$_{0.11}$Ga$_{0.89}$N barrier layer of the multiple quantum well (with a Si concentration of 1.1-1.5$\times 10^{19}$ cm$^{-3}$) to 0.01 µm, a Si-doped n-type Al$_{0.11}$Ga$_{0.89}$N layer (with a Si concentration of 0.8-1.0$\times 10^{19}$ cm$^{-3}$) to 0.01 µm, a non-doped Al$_{0.11}$Ga$_{0.89}$N spacer layer to 0.02 µm, a Mg-doped p-type Al$_{0.28}$Ga$_{0.72}$N cladding layer (with a Mg concentration of $1 \times 10^{19}$ cm$^{-3}$) to 0.02 µm, a Mg-doped p-type GaN contact layer (with a Mg concentration of $1 \times 10^{19}$ cm$^{-3}$) to 0.1 µm, and a highly Mg-doped p-type GaN contact layer (with a Mg concentration of $2 \times 10^{20}$ cm$^{-3}$) to 0.02 µm.

In this example, the Si-doped n-type GaN contact layer corresponds to the n-type semiconductor layer 1, and the Mg-doped p-type GaN contact layer corresponds to the p-type semiconductor layer 2.

By setting the Mg concentration in the Mg-doped p-type GaN contact layer to a relatively high level on the order of $1 \times 10^{20}$ cm$^{-3}$, its ohmic contact with the p-side electrode is improved. However, in the case of semiconductor light emitting diodes, as opposed to semiconductor laser diodes, the distance between the contact layer and the light emitting layer is small, causing concern about characteristics degradation due to Mg diffusion. Thus, by taking advantage of the large contact area between the p-side electrode and the contact layer and the low current density during operation, the Mg concentration can be reduced to the order of $1 \times 10^{19}$ cm$^{-3}$ without substantially compromising electrical characteristics to prevent Mg diffusion and improve light emission characteristics.

The first AlN buffer layer with high carbon concentration serves to alleviate its difference in crystal form from the substrate, and particularly reduces screw dislocations. The second AlN buffer layer with high purity has a flat surface at the atomic level. This reduces defects in the non-doped GaN buffer layer grown thereon. To this end, the thickness of the second AlN buffer layer with high purity is preferably larger than 1 µm. Furthermore, to avoid warpage due to strain, the thickness is preferably 4 µm or less. The second AlN buffer layer with high purity is not limited to AlN, but can be Al$_x$Ga$_{1-x}$N ($0.8 \leq x \leq 1$) to compensate for wafer warpage.

The non-doped GaN buffer layer serves to reduce defects by three-dimensional island growth on the second AlN buffer layer with high purity. The average thickness of the non-doped GaN buffer layer needs to be 2 µm or more to achieve a flat growth surface. From the viewpoint of reproducibility and warpage reduction, it is suitable that the total thickness of the non-doped GaN buffer layer is 4 to 10 µm.

Use of these buffer layers successfully reduces defects to approximately 1/10 of those in the conventional low-temperature grown AlN buffer layer. This technique enables fabrication of a semiconductor light emitting device with high efficiency despite its capability of emission in the ultraviolet band.

Next, formation of electrodes on the semiconductor layer is described.

First, as shown in FIG. 1A, the p-type semiconductor layer 2 and the light emitting layer 3 are removed by dry etching using a mask so that the n-type contact layer is exposed to the surface in a region of the p-type semiconductor layer 2. Then, a dielectric film 8 illustratively made of an SiO$_2$ film is laminated 400 nm using a thermal CVD system throughout the semiconductor layer including the exposed n-type semiconductor layer 1.

To form a p-side electrode 4, first, a patterned resist for resist lift-off is formed on the semiconductor layer, and the SiO$_2$ film on the p-type contact layer is removed by ammonium fluoride treatment. In this process, the time for ammonium fluoride treatment is adjusted so that the p-type contact layer is exposed between Ag of the first metal film 5, described below, and the SiO$_2$ film of the dielectric film 8. As a specific example, in the case where the etching rate is 400 nm/min, the sum of the time for removing the SiO$_2$ film in the region for forming Ag and the time for overetching to expose the p-type contact layer 2 immediately beside the above region with a width of 1 μm is approximately three and a half minutes. In the region where the SiO$_2$ film is removed, a first metal film 5 made of Ag is formed with a thickness of 200 nm using a vacuum evaporation system, and sintered in a nitrogen atmosphere at 350° C. for one minute.

Likewise, a patterned resist for resist lift-off is formed on the semiconductor layer, and a second metal film 6 illustratively made of Pt/Au is formed with a thickness of 500 nm to cover the entire region provided with Ag, the entire region of the p-type contact layer exposed to the surface immediately beside Ag, and part of the SiO$_2$ film. Thus, a p-side electrode 4 is formed.

To form an n-side electrode 7, a patterned resist for resist lift-off is formed on the semiconductor layer, and the SiO$_2$ film on the exposed n-type contact layer is removed by ammonium fluoride treatment. In the region where the SiO$_2$ film is removed, an n-side electrode 7 illustratively made of Ti/Pt/Au is formed with a thickness of 500 nm.

Then, discrete semiconductor light emitting devices are produced by cleavage or diamond blade cutting.

The material used for each layer is not limited to the above example. The semiconductor layers can be illustratively made of nitride semiconductors such as Al$_x$Ga$_{1-x-y}$In$_y$N (x≧0, y≧0, x+y≦1). The method for forming these semiconductor layers is not particularly limited, but it is possible to use crystal growth techniques such as metal organic chemical vapor deposition and molecular beam epitaxy.

The material of the substrate 10 is also not particularly limited, but it is possible to use common substrate materials such as sapphire, SiC, GaN, GaAs, and Si. The substrate may be finally removed.

The dielectric film 8 can be made of oxides, nitrides, or oxynitrides of Si, Al, Zr, Ti, or Nb. Furthermore, the dielectric film 8 can be composed of two or more layers. The total thickness of the laminated dielectric film is preferably 50 nm or more from the viewpoint of ensuring insulation, and preferably 1000 nm or less from the viewpoint of avoiding cracks in the dielectric film. Because the dielectric film 8 is separated from the first metal film 5 without contact therebetween, the type and formation method of the dielectric film, which is most suitable with respect to the manufacturing cost, the manufacturing process, and the characteristics of the semiconductor light emitting device, can be freely selected without consideration of its influence on the first metal film 5.

The material of the n-side electrode 7 is also not particularly limited, but it can be a single-layer or multilayer conductive film used as an ohmic electrode of the n-type semiconductor.

The p-side electrode 4 is composed of a first metal film 5 containing at least silver or a silver alloy and a second metal film 6 made of a metal not containing silver. The first metal film 5 can be made of a single layer of silver, or an alloy layer containing a metal other than silver. The first metal film 5 serves to efficiently reflect the light from the light emitting layer 3. Typically, the reflection efficiency of a single-layer metal film for the visible band tends to decrease as the wavelength becomes shorter. However, silver has high reflectivity also for light in the ultraviolet band of 370 nm or more and 400 nm or less. Hence, in the case of a semiconductor light emitting device suitable for ultraviolet emission with the first metal film 5 made of a silver alloy, it is preferable to increase the component ratio of silver in the first metal film 5 near the interface with the semiconductor layer. The thickness of the first metal film 5 is preferably 100 nm or more to ensure sufficient light reflection efficiency, and its area is preferably as large as possible.

The increase of the distance between the first metal film 5 and the n-side electrode 7 reduces the risk of insulation failure and breakdown voltage failure due to migration of silver. Conversely, the decrease of the distance between the first metal film 5 and the n-side electrode 7 effectively increases the area of the first metal film 5 serving as a metal reflection film, and improves the light extraction efficiency. With regard to the current path from the first metal film 5 to the n-side electrode 7, the current concentrates on the location with the shortest distance between the first metal film 5 and the n-side electrode 7. Hence, the distance therebetween is preferably constant independent of the location. Furthermore, in plan view, as the length of the region in which the first metal film 5 faces the n-side electrode 7 increases, the number of current paths from the first metal film 5 to the n-side electrode 7 increases, and hence alleviates electric field concentration. With these effects into consideration, it is possible to suitably determine the area and shape of the exposed n-type contact layer, the area and shape of the first metal film 5, the area and shape of the n-side electrode 7, the distance between the first metal film 5 and the dielectric film 8, and the distance between the first metal film 5 and the n-side electrode 7.

The second metal film 6 is made of a metal not containing silver, and is in electrical contact with the first metal film 5. The material of the second metal film 6 is not particularly limited, but it can be a single-layer or multilayer metal film, a metal alloy layer, a single-layer or multilayer conductive oxide film, or any combination thereof. The thickness of the second metal film 6 is not particularly limited, but can be selected illustratively in the range of 100 to 1000 nm.

With regard to the electrical characteristics of the junction between the second metal film 6 and the p-type contact layer, which is the top layer of the p-type semiconductor layer 2, this junction preferably has a higher contact resistance than the junction between the first metal film 5 and the p-type contact layer. This facilitates efficiently injecting a current into the light emitting layer 3 located directly below the first metal film 5 and allows the light emitted from directly below the first metal film 5 to be efficiently reflected toward the substrate. Hence, the light extraction efficiency can be increased.

The second metal film 6 covers the first metal film 5, the p-type contact layer exposed between the first metal film 5 and the dielectric film 8, and part of the dielectric film 8. In particular, it is preferable that the portion of the dielectric film 8 facing the n-side electrode 7 be entirely covered. In view of the pattern alignment accuracy during the manufacturing process, the area of the first metal film 5 serving as a reflection film, and the strength of electric field applied between the second metal film 6 and the p-type semiconductor layer 2, the second metal film 6 preferably extends in the range from 0.1 μm onto the dielectric film 8 to 0.1 μm before the edge thereof. In the case where a contact exposure system, which is inexpensive but based on unit-magnification exposure with poor alignment accuracy, is used in view of manufacturing cost, the above range is preferably from 1 μm onto the dielectric film 8 to 1 μm before the edge thereof. Furthermore, to increase the yield, the above range is more preferably from 3 μm onto the dielectric film 8 to 3 μm before the edge thereof.

Figure 2A:
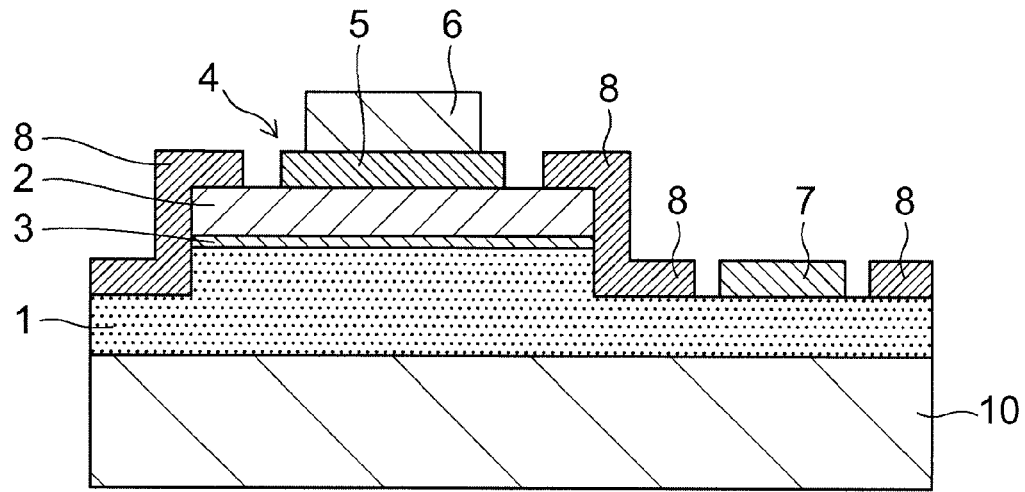
FIG. 2A is a schematic cross-sectional view showing the structure of a semiconductor light emitting device according to a comparative example.
Figure 2B:
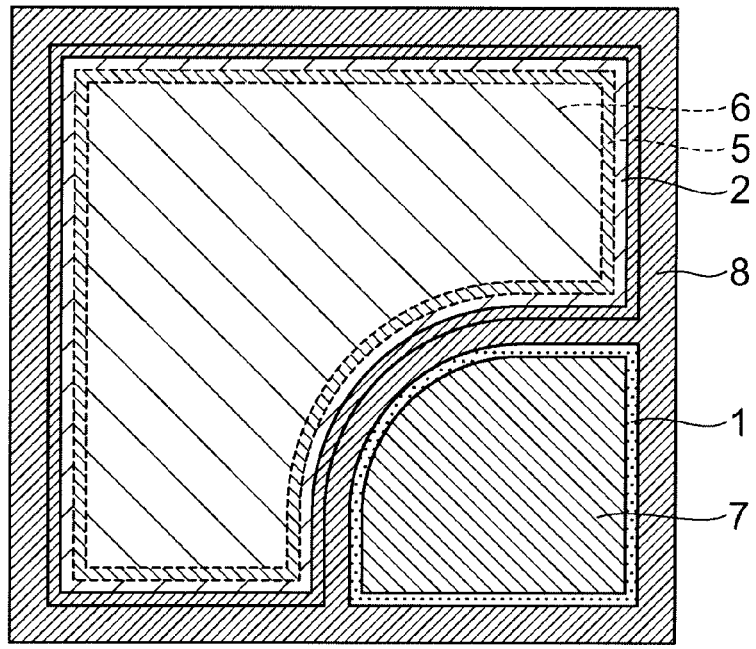
FIG. 2B is a schematic plan view thereof.

FIG. 2 is a schematic cross-sectional view showing the structure of a semiconductor light emitting device according to a comparative example.

The structure and manufacturing method of the semiconductor light emitting device according to the comparative example is now described. The same components as those of the semiconductor light emitting device shown in FIG. 1 are labeled with like reference numerals, and the detailed description thereof is omitted.

The second metal film 6 is provided only on the first metal film 5, and does not cover the exposed region of the p-type contact layer between the first metal film 5 and the dielectric film 8, and the dielectric film 8.

To form a p-side electrode 4, a patterned resist for resist lift-off is formed on the semiconductor layer, and the $SiO_2$ film on the p-type contact layer is removed by ammonium fluoride treatment. In the region where the $SiO_2$ film is removed, Ag is formed with a thickness of 200 nm using a vacuum evaporation system. Likewise, a patterned resist for resist lift-off is formed on the semiconductor layer, and Pt/Au is formed with a thickness of 500 nm to cover part of the region provided with Ag. Thus, a p-side electrode 4 with the edge of Ag exposed is formed.

The n-side electrode can be formed by the same method as described above with reference to FIG. 1.

Figure 3:
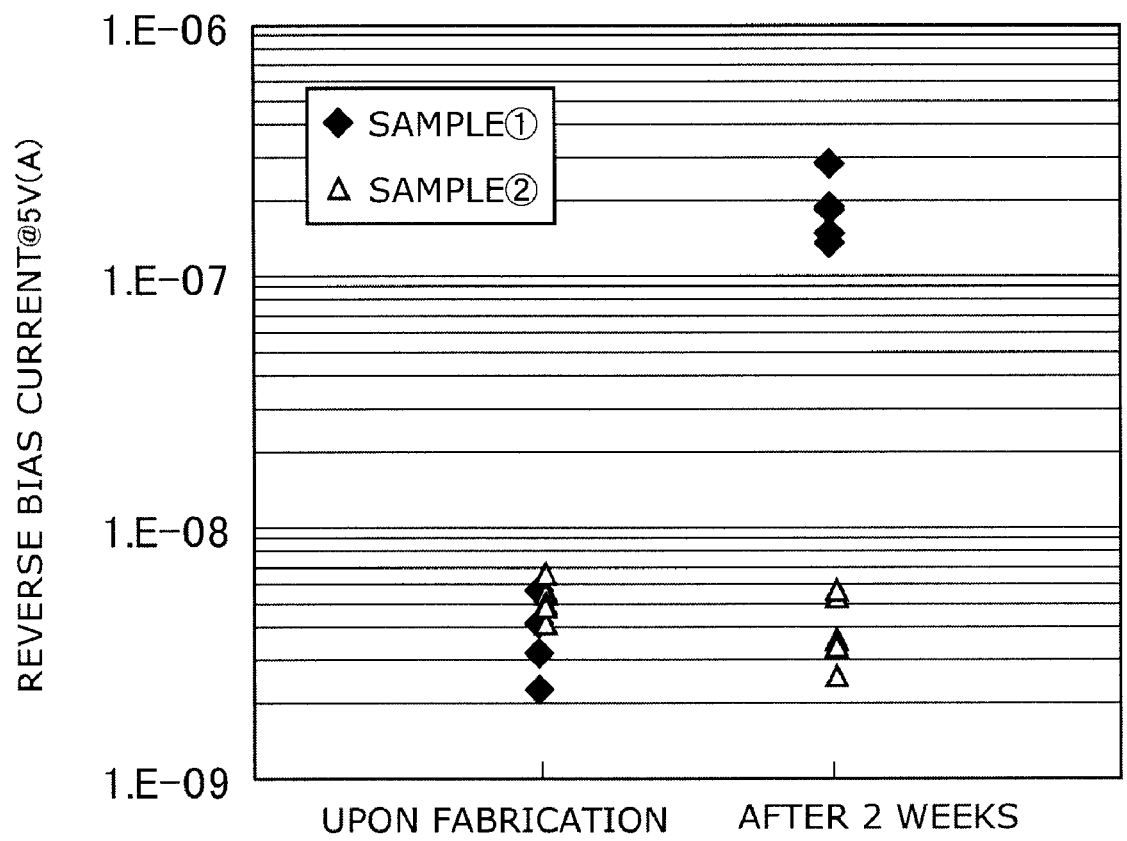
FIG. 3 is a graph showing the measurement time dependence of reverse bias current for the semiconductor light emitting device operated at 5 V.

FIG. 3 is a graph showing the measurement time dependence of reverse bias current for the semiconductor light emitting device operated at 5 V.

Here, sample (1) represents the semiconductor light emitting device according to the comparative example, and sample (2) represents the semiconductor light emitting device according to this embodiment. The horizontal axis represents measurement time. "UPON FABRICATION" refers to the case where the semiconductor light emitting device was characterized immediately after fabrication, and "AFTER 2 WEEKS" refers to the case of characterization after it was left standing for two weeks in a normal atmosphere other than a cleanroom and the like. According to this embodiment, the reverse bias current scarcely changes even after two weeks. However, in the comparative example, the reverse bias current significantly increases after two weeks, indicating that the semiconductor light emitting device is degraded.

Next, energization accelerated aging tests for this embodiment and the comparative example are described.

Figure 4:
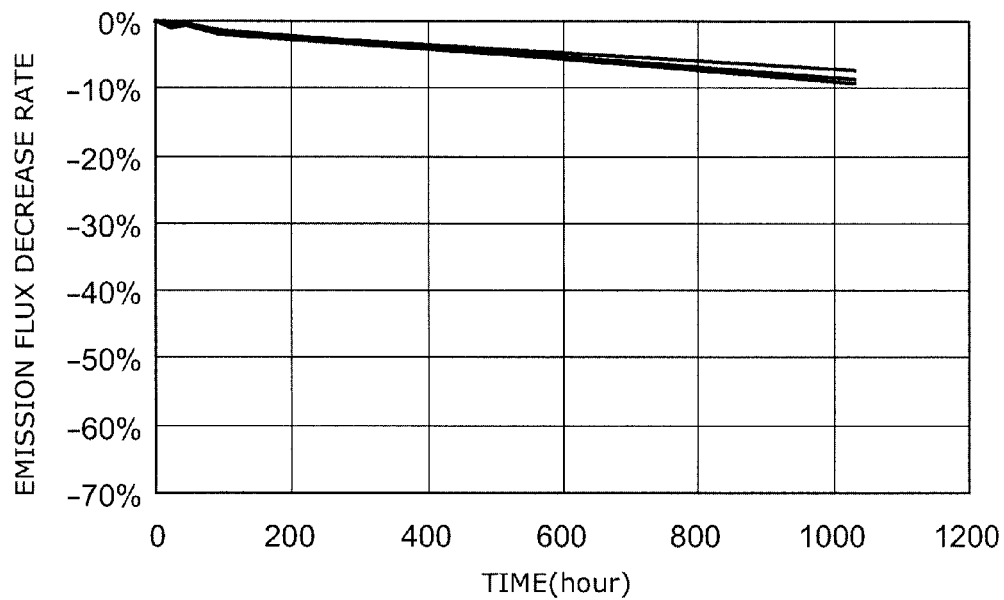
FIGS. 4 and 5 are graphs showing the rate of change of the emission flux of the semiconductor light emitting device.
Figure 5:
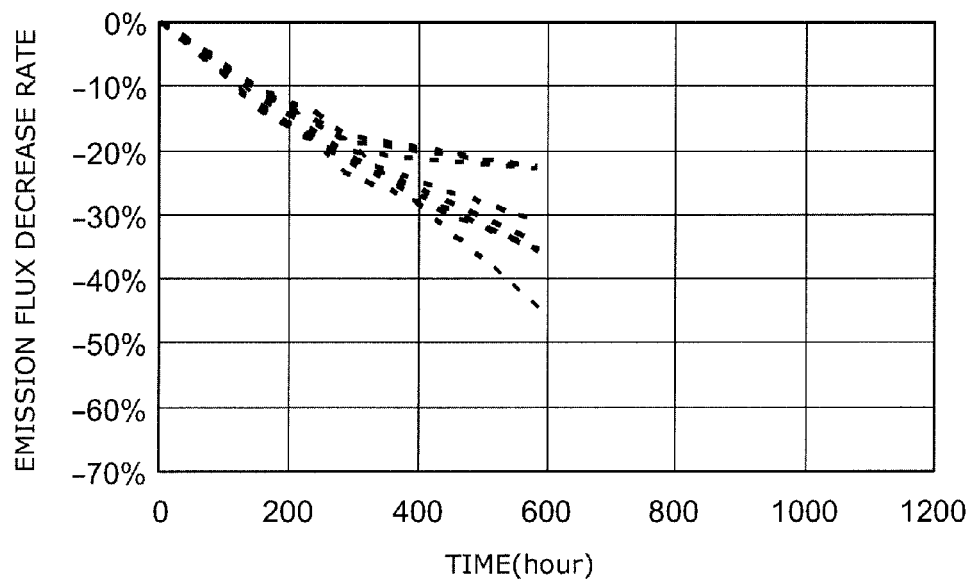

FIGS. 4 and 5 are graphs showing the rate of change of the emission flux of the semiconductor light emitting device controlled at a current of 50 mA (automatic current control (ACC)) in this embodiment and the comparative example. In both cases, the ambient temperature was $T_a=25°$ C., and the number of samples was eight. With the passage of time, the emission flux upon 50-mA injection gradually decreases. In this embodiment, the decrease rate of emission flux per unit time (mW/h) after 1000 hours is less than 10%. The comparative example exhibits a large decrease rate of emission flux per unit time, which reaches 20% to 45% after 600 hours. That is, the decrease rate of emission flux per unit time in the comparative example is approximately 3 to 5 times that in this embodiment.

In the comparative example, because of its electrode layout, electric field concentration is likely to occur near the edge of the p-side electrode 4 on the side closer to the n-side electrode 7. Furthermore, the comparative example has a region where silver is exposed to ambient air. Hence, energization and long-term exposure may tend to accelerate migration, oxidation, and sulfidation of silver. In addition, in the case of high-efficiency ultraviolet light emitting device like this embodiment, the silver electrode is exposed to high-energy wavelengths at high optical density. Such an environment is likely to accelerate migration, oxidation, and sulfidation of silver. It is considered that, as a result of these factors, the comparative example incurs the decrease of emission intensity, lifetime, and breakdown voltage as shown in FIGS. 3 and 5.

According to this embodiment, the first metal film 5 made of silver or a silver alloy is covered with the second metal film 6, and hence isolated from ambient air and the dielectric film 8. Thus, the first metal film 5 is less likely to be exposed to moisture and impurity ions, and migration, oxidation, and sulfidation of silver can be prevented. Furthermore, the second metal film 6 is formed immediately beside the edge of the first metal film 5 facing the n-side electrode 7, allowing a current path to be formed immediately beside the first metal film 5. This alleviates current concentration on the first metal film 5. Simultaneously, a region sandwiched between the p-type semiconductor layer 2 and the second metal film 6 occurs near the edge of the dielectric film 8 facing the edge of the first metal film 5. Hence, a weak electric field is applied across the dielectric film 8 between the p-type semiconductor layer 2 and the second metal film 6. This results in a structure in which the electric field is gradually weakened from the first metal film 5 to the dielectric film 8. Hence, electric field concentration in this region can be alleviated. Furthermore, the manufacturing process requires no special ingenuity, but the device can be formed in the same process and number of steps as in conventional techniques. These effects allow a semiconductor light emitting device to achieve reduction of leakage current, improvement in insulation characteristics, improvement in breakdown voltage characteristics, improvement in emission intensity, increase of lifetime, high throughput, and low cost.

A long length of the second metal film 6 extending on the dielectric film 8 is favorable to realizing a structure for alleviating electric field through the dielectric film 8, but increases the danger of short-circuiting to the n-side electrode 7. On the other hand, if the length is short, there is no danger of short-circuiting to the n-side electrode 7.

Figure 6:
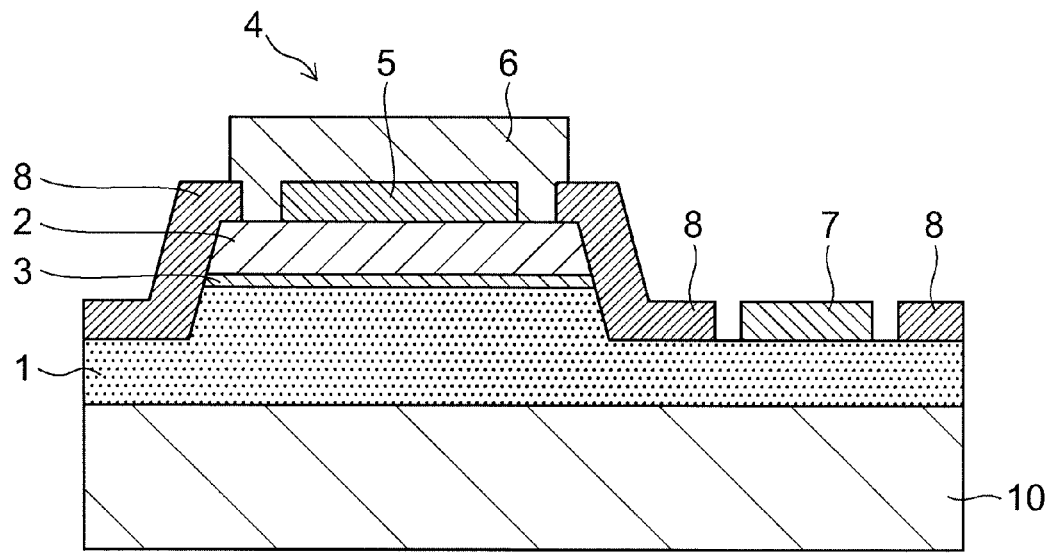
FIG. 6 is a schematic cross-sectional view showing the structure of a semiconductor light emitting device according to a second embodiment of the invention.

FIG. 6 is a schematic cross-sectional view showing the structure of a semiconductor light emitting device according to a second embodiment of the invention. The same components as those described above with reference to FIG. 1 are labeled with like reference numerals, and the detailed description thereof is omitted.

In this embodiment, the cross section of the semiconductor layers sandwiching the light emitting layer 3 is tapered, and in accordance therewith, the dielectric film 8 obliquely covers the tapered portion. The second metal film 6 covers up to the edge of the dielectric film 8 on the first metal film 5 side. The taper serves to prevent film discontinuity due to the step difference. There is a large refractive index difference between the nitride semiconductor layer and the sapphire substrate. Part of the emitted light is reflected at the interface therebetween and returned to the semiconductor layer. This reflected light repeats reflection between the first metal film 5 and the above interface, and is confined inside the semiconductor layer. In contrast, the taper provided as in this embodiment can change the reflection angle of the light, which increases the probability of extracting the light to the substrate side. Thus, the light extraction efficiency is improved.

Figure 7:
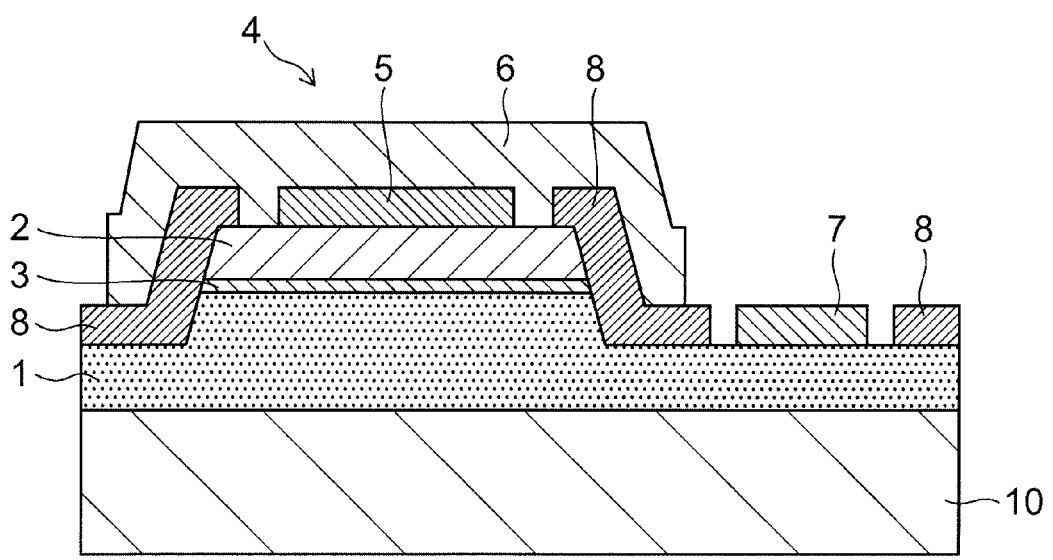
FIG. 7 is a schematic cross-sectional view showing the structure of a semiconductor light emitting device according to a third embodiment of the invention.

FIG. 7 is a schematic cross-sectional view showing the structure of a semiconductor light emitting device according to a third embodiment of the invention. The same components as those described above with reference to FIG. 1 are labeled with like reference numerals, and the detailed description thereof is omitted.

In the case where the semiconductor layers including the light emitting layer 3 are tapered, the area of the dielectric film 8 covered with the second metal film 6 can be expanded. The second metal film 6 covers up to the edge of the dielectric film 8 on the n-side electrode 7 side.

This structure is effective in alleviating electric field. In addition, the oblique region of the second metal film 6 is expected to produce a light reflection effect.

A point light source is inherently favorable to the light extraction efficiency, and from this viewpoint, a small p-side electrode 4 is desirable. However, from the viewpoint of reflection, a large p-side electrode 4 is desirable. It is preferable to provide an area for reflection, besides the area for ohmic contact with the p-type semiconductor layer 2. Thus, the tapered region of the second metal film 6 can contribute to high-efficiency reflection.

Figure 8:
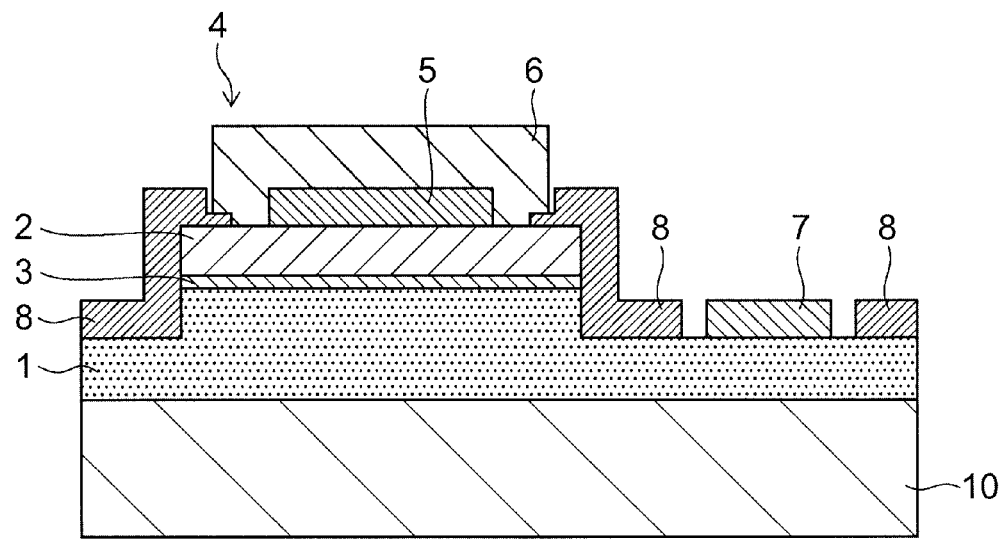
FIG. 8 is a schematic cross-sectional view showing the structure of a semiconductor light emitting device according to a fourth embodiment of the invention.

FIG. 8 is a schematic cross-sectional view showing the structure of a semiconductor light emitting device according to a fourth embodiment of the invention. The same components as those described above with reference to FIG. 1 are labeled with like reference numerals, and the detailed description thereof is omitted.

This embodiment is different from the first embodiment in that the thickness of the region of the dielectric film 8 covered with the second metal film 6 is thinner than the thickness of the region of the dielectric film 8 not covered with the second metal film 6.

Formation of electrodes on the semiconductor layer in this embodiment is described.

To form a p-side electrode 4, a patterned resist for resist lift-off is formed on the semiconductor layer, and the $SiO_2$ film on the p-type contact layer is removed by ammonium fluoride treatment. In this process, the time for ammonium fluoride treatment is adjusted so that the p-type contact layer is exposed between Ag, described below, and the $SiO_2$ film. In the region where the $SiO_2$ film is removed, a first metal film 5 made of Ag is formed with a thickness of 200 nm using a vacuum evaporation system, and sintered in a nitrogen atmosphere at 350° C. for one minute.

Likewise, a patterned resist for resist lift-off is formed on the entire region provided with Ag, the entire region of the p-type contact layer exposed to the surface immediately beside Ag, and the dielectric film 8 except its edge in contact with this exposed region. Ammonium fluoride treatment is performed as a preprocess of metal film evaporation to etch the edge of the dielectric film 8. In this process, the time for ammonium fluoride treatment is adjusted so that the edge of the dielectric film 8 made of the $SiO_2$ film exposed from the resist does not vanish. Specifically, in the case where the etching rate is 400 nm/min, the time is within 1 minute. Thus, the 400-nm $SiO_2$ is trimmed, and the edge has a thickness of approximately 200 nm. Then, a second metal film 6 made of Pt/Au is formed with a thickness of 500 nm to form a p-side electrode 4. Finally, an n-side electrode 7 is formed in the same method as in the first embodiment.

In this embodiment, it is possible to adjust the strength of electric field applied to the dielectric film 8 by adjusting the thickness of the dielectric film 8 sandwiched between the second metal film 6 and the p-type contact layer. Consequently, the distribution of electric field applied to the area surrounding the first metal film 5 can be adjusted in accordance with the operating current, shape, size, and layout of the semiconductor light emitting device.

Next, a fifth embodiment of the invention is described.

Figure 9:
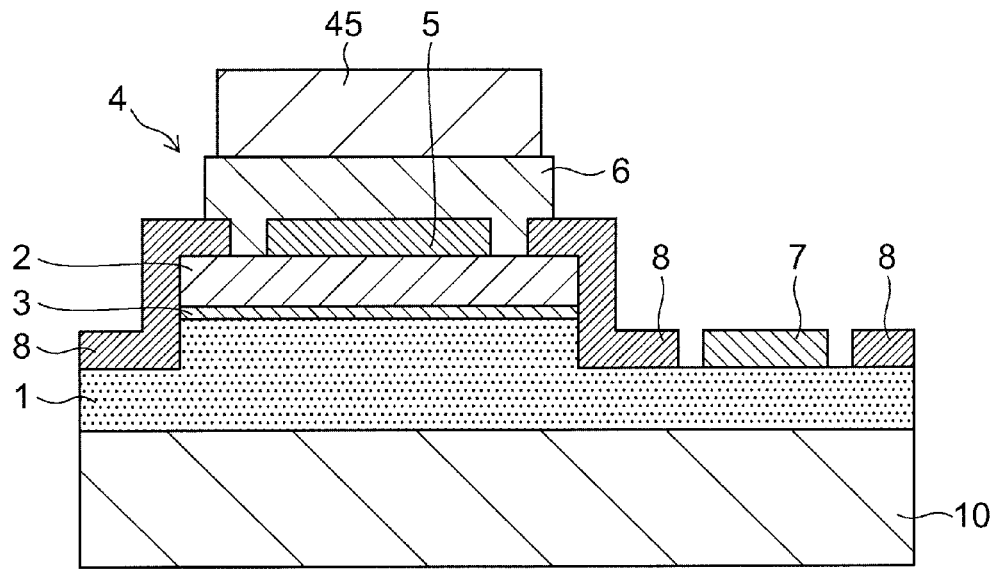
FIG. 9 is a schematic cross-sectional view showing the structure of a semiconductor light emitting device according to the fifth embodiment of the invention.

FIG. 9 is a schematic cross-sectional view showing the structure of a semiconductor light emitting device according to the fifth embodiment of the invention.

In the semiconductor light emitting device 100 of FIG. 1, a pad 45 made of Au is formed with a thickness of 2000 nm to cover partly or entirely the region provided with Pt/Au, that is, the second metal film 6. This enhances bondability, and improvement in heat dissipation of the semiconductor light emitting device can be also expected. This pad 45 can also be used as a gold bump, or an AuSn bump can be formed instead of Au. The pad can be simultaneously formed as the pad formed on the n-side electrode 7.

In the case of separately providing a pad 45 to enhance bondability for wire bonding, enhance die shear strength during gold bump formation by a ball bonder, and enable flip-chip mounting, the thickness of the pad 45 is not particularly limited, but can be selected illustratively in the range of 100 to 5000 nm.

Next, a sixth embodiment of the invention is described.

Figure 10:
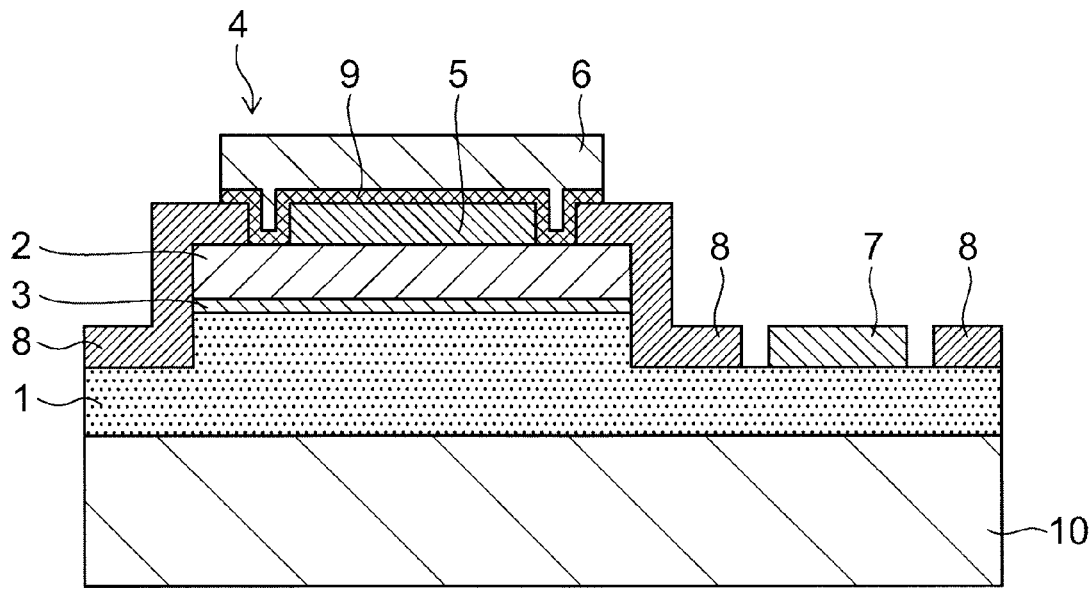
FIG. 10 is a schematic cross-sectional view of a semiconductor light emitting device according to the sixth embodiment.

FIG. 10 is a schematic cross-sectional view of a semiconductor light emitting device according to the sixth embodiment.

The same components as those described above with reference to FIG. 1 are labeled with like reference numerals, and the detailed description thereof is omitted. This embodiment is different from that shown in FIG. 1 in that a third metal film 9 is added between the first metal film 5 and the second metal film 6.

A third metal film 9, which does not react with silver or not actively diffuse into silver and is in electrical contact with the first metal film 5 and the second metal film 6, can be provided between the first metal film 5 and the second metal film 6 in order to prevent the second metal film 6 from diffusing into or reacting with the first metal film 5. The third metal film 9 can be a single-layer or laminated film usable as a diffusion prevention layer made of a high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), osmium (Os), iridium (Ir), and platinum (Pt).

To ensure that no problem occurs due to some diffusion into the first metal film 5, it is more preferable to use a metal having a high work function and being likely to form ohmic contact with the p-GaN contact layer, such as iron (Fe), cobalt (Co), nickel (Ni), rhodium (Rh), tungsten (W), rhenium (Re), osmium (Os), iridium (Ir), and platinum (Pt). In the case of a single-layer film, the thickness of the third metal film 9 is preferably in the range of 5 to 200 nm to maintain the film condition. In the case of a laminated film, the thickness is not particularly limited, but can be selected illustratively in the range of 10 to 10000 nm.

To form a p-side electrode 4, a patterned resist for resist lift-off is formed on the semiconductor layer, and the $SiO_2$ film on the p-type contact layer is removed by ammonium fluoride treatment. In this process, the time for ammonium fluoride treatment is adjusted so that the p-type contact layer is exposed between Ag and the $SiO_2$ film. In the region where the $SiO_2$ film is removed, a first metal film 5 made of Ag is formed with a thickness of 200 nm using a vacuum evaporation system, and sintered in a nitrogen atmosphere at 350° C. for one minute. Likewise, a patterned resist for resist lift-off is formed on the entire region provided with Ag, which is the first metal film 5, the entire region of the p-type contact layer exposed to the surface immediately beside Ag, and the dielectric film 8 made of $SiO_2$ except its edge in contact with this exposed region.

Then, a third metal film 9 illustratively made of six layers of W/Pt film is laminated with the total thickness of (W/Pt)×6 layers set to 900 nm. Then, a p-side electrode 4 is formed.

When the semiconductor light emitting device according to this embodiment is further fixed to a submount, the second metal film 6 does not diffuse into Ag of the first metal film 5 even if AuSn solder is used, which requires heat treatment at a relatively high temperature of 300° C. or more, because the W/Pt laminated film serves as a barrier layer. Lamination of thin layers of high melting point metals having different linear expansion coefficients can ensure a large thickness as a diffusion prevention layer while alleviating strain.

Figure 11:
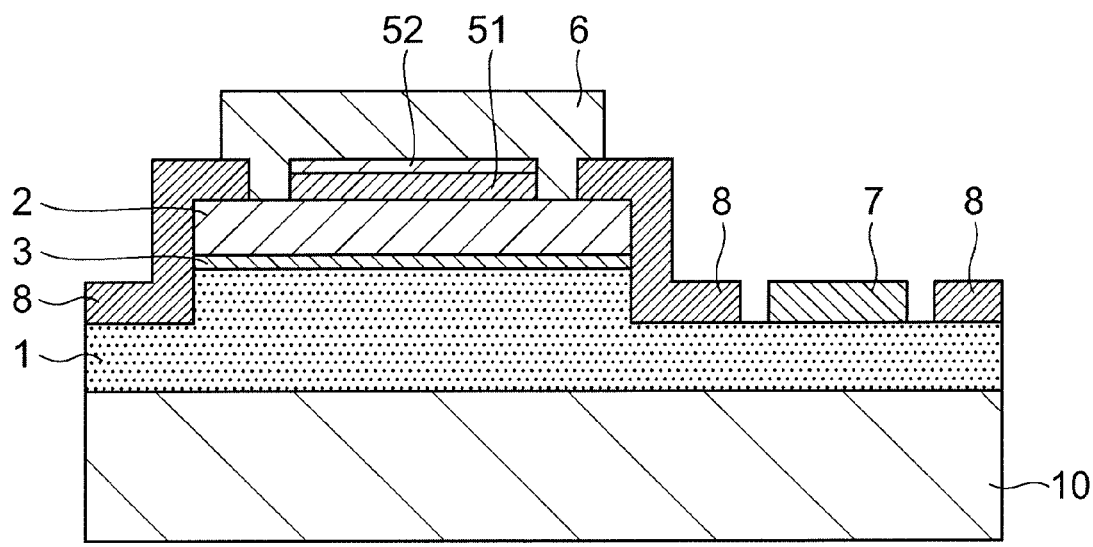
FIG. 11 is a schematic cross-sectional view of a semiconductor light emitting device according to a seventh embodiment of the invention.

FIG. 11 is a schematic cross-sectional view of a semiconductor light emitting device according to a seventh embodiment of the invention.

This embodiment is different from the embodiment described above with reference to FIG. 1 in that the first metal film 5 of the semiconductor light emitting device 100 in FIG. 1 is changed from Ag to Ag/Pt.

The same components as those described above with reference to FIG. 1 are labeled with like reference numerals, and the detailed description thereof is omitted.

To form a p-side electrode 4, a patterned resist for resist lift-off is formed on the semiconductor layer, and the $SiO_2$ film on the p-type contact layer is removed by ammonium fluoride treatment. In the region where the $SiO_2$ film is removed, a laminated film composed of a first metal film A, 51, made of Ag and a first metal film B, 52, made of Pt is formed with a thickness of 200 nm using a vacuum evaporation system, and sintered in a nitrogen atmosphere at 350° C. for one minute. Likewise, a patterned resist for resist lift-off is formed on the semiconductor layer, and Pt/Au is formed with a thickness of 500 nm to cover the entire region provided with Ag/Pt, the entire region of the p-type contact layer exposed to the surface immediately beside Ag, and part of the $SiO_2$ film. Thus, a p-side electrode 4 is formed.

The first metal film 5 is formed from an Ag/Pt laminated film and then sintered. Thus, a trace amount of Pt can be diffused into the interface between the p-type GaN contact layer and Ag. This improves adhesiveness of Ag, and can decrease contact resistance without compromising the high-efficiency reflection characteristics specific to Ag. Hence, the high-efficiency reflection characteristics and low operating voltage characteristics required for the p-side electrode 4 can be made highly compatible. Specifically, as compared with the first embodiment, the operating voltage at 20 mA is decreased by 0.3 V while the optical output remains at nearly the same value.

Figure 12:
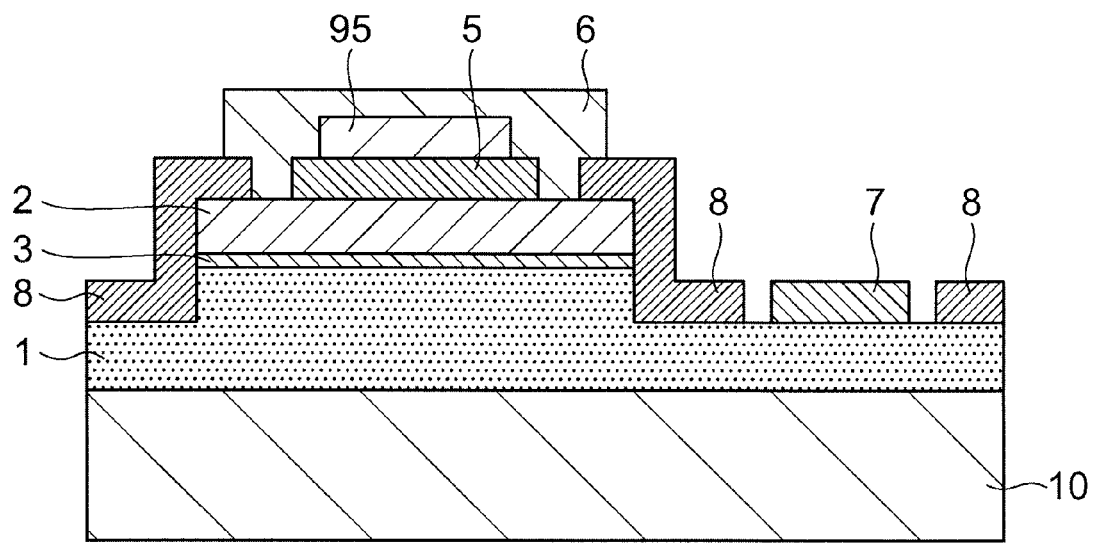
FIG. 12 is a schematic cross-sectional view of a semiconductor light emitting device according to an eighth embodiment of the invention.

FIG. 12 is a schematic cross-sectional view of a semiconductor light emitting device according to an eighth embodiment of the invention.

This embodiment is different from the embodiments described above with reference to FIGS. 1 and 11 in that a fourth metal film 95 is formed as a diffusion prevention layer separately from the p-side electrode 4 and the third metal film 9.

The same components as those described above with reference to FIGS. 1 and 11 are labeled with like reference numerals, and the detailed description thereof is omitted.

To form a p-side electrode 4, a patterned resist for resist lift-off is formed on the semiconductor layer, and the $SiO_2$ film on the p-type contact layer is removed by ammonium fluoride treatment. In the region where the $SiO_2$ film is removed, a first metal film 5 made of Ag/Pt is formed with a thickness of 200 nm using a vacuum evaporation system, and sintered in a nitrogen atmosphere at 350° C. for one minute. Likewise, a patterned resist for resist lift-off is formed on the semiconductor layer, and a fourth metal film 95 made of Pt/Au is formed with a thickness of 500 nm so as to cover a region on Ag/Pt which is set back from the edge of Ag/Pt by approximately 5 μm. Likewise, a patterned resist for resist lift-off is formed on the semiconductor layer, and a second metal film 6 made of Ti/Pt/Au is formed with a thickness of 500 nm to cover the entirety of Pt/Au, the entirety of Ag/Pt, the entire region of the p-type contact layer exposed to the surface immediately beside Ag, and part of the $SiO_2$ film. Thus, a p-side electrode 4 is formed. When the final Ti/Pt/Au is formed, the n-side electrode 7 having a Ti/Pt/Au structure can be simultaneously formed.

When the semiconductor light emitting device according to this embodiment is fixed to a submount, the second metal film 6 does not diffuse into the interface between the p-type GaN contact layer and Ag even if AuSn solder is used, which requires heat treatment at a relatively high temperature of 300° C. or more, because the fourth metal film 95 made of Pt/Au serves as a barrier layer. Ti is in direct contact with the region at the edge of Ag/Pt and slightly diffuses therein. Thus, the contact resistance of that region is slightly increased. This results in a structure in which the current density decreases outwardly from the ohmic region. Hence, current concentration on the edge of Ag/Pt can be alleviated, and the reliability of the semiconductor light emitting device can be improved.

Figure 13A:
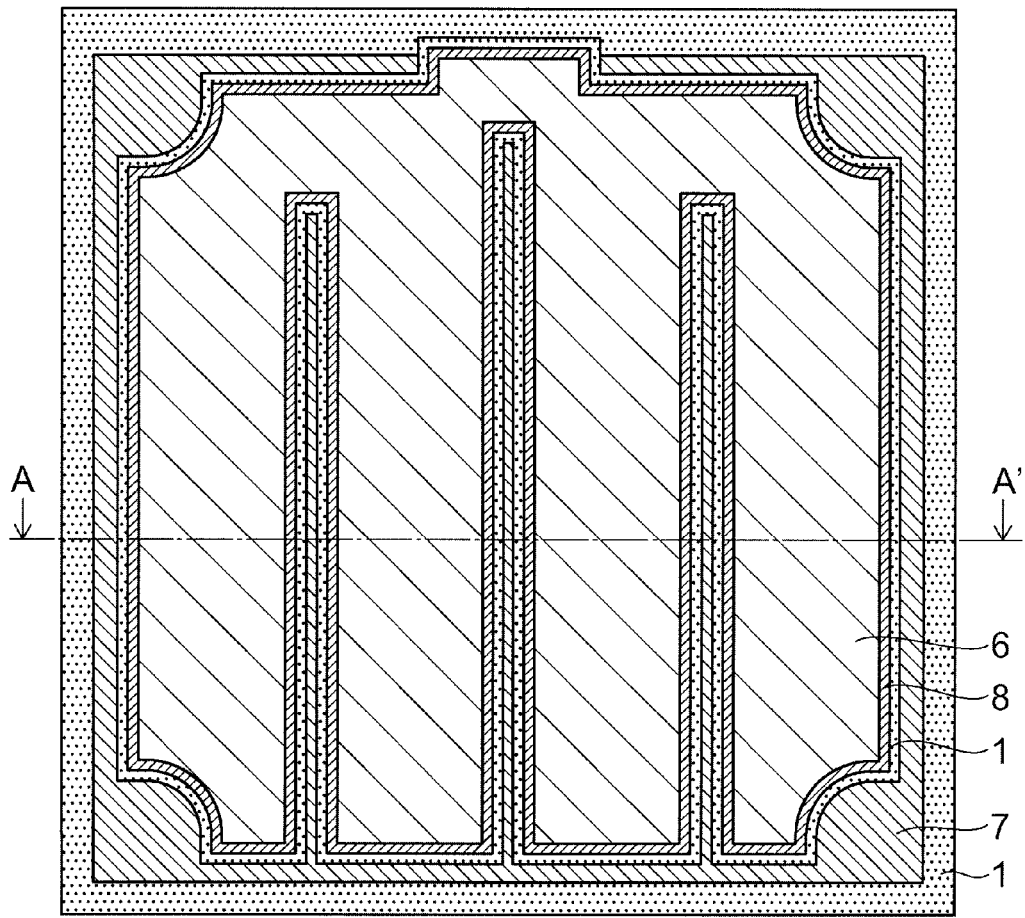
FIG. 13A shows a plan view illustrating a variation of the electrode pattern in the semiconductor light emitting device of the present embodiments.
Figure 13B:
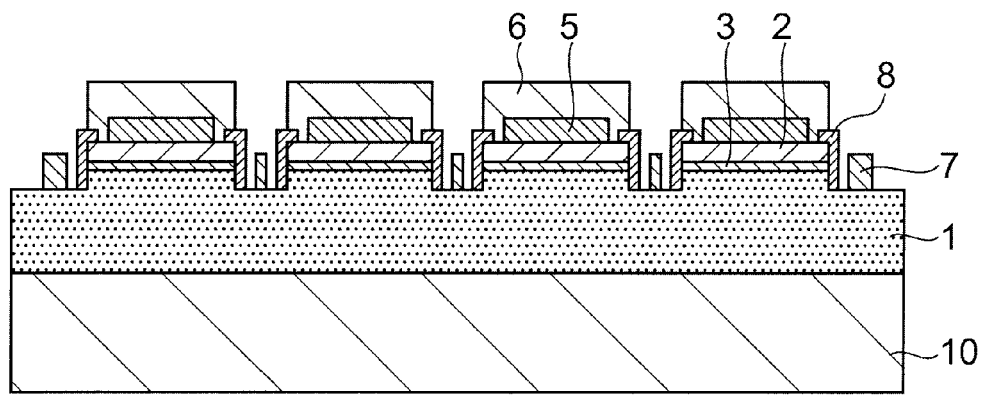
FIG. 13B shows a schematic cross-sectional view taken along AA'.

FIG. 13 shows a plan view illustrating a variation of the electrode pattern in the semiconductor light emitting device of the present embodiments, and a schematic cross-sectional view taken along AA'.

The current injected from outside the semiconductor light emitting device 100 into the p-side electrode 4 is passed through the semiconductor layers and flows to the n-side electrode 7. The n-side electrode region for extracting this current to the outside of the semiconductor device is preferably designed to have a large area in view of contact between the semiconductor light emitting device and the external terminal. However, its layout and shape are not particularly limited, but can be freely designed so as to achieve high light emission efficiency.

In this variation, the p-side electrodes 4 and the n-side electrodes 7 mesh with each other in a comb-like configuration.

Figure 14:
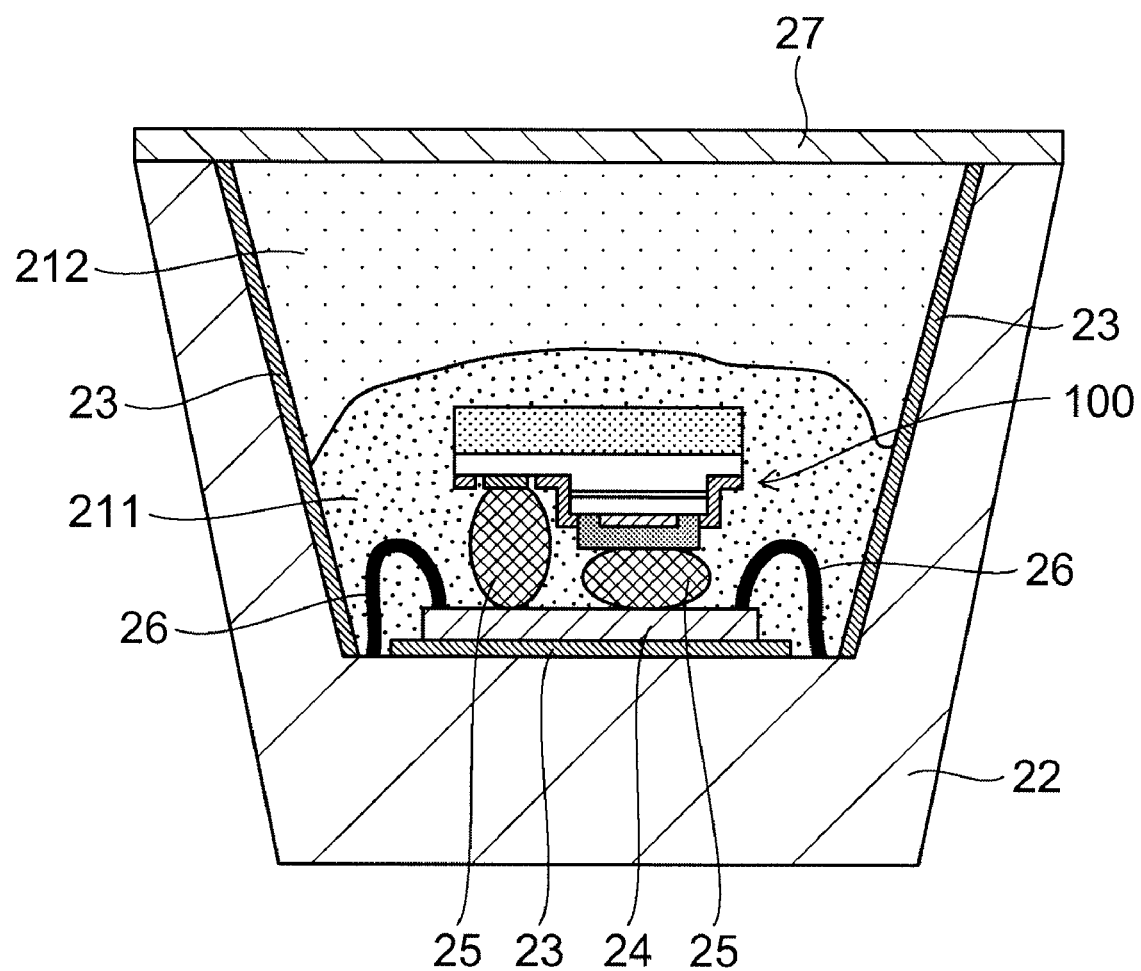
FIG. 14 is a schematic cross-sectional view of a semiconductor light emitting apparatus based on the semiconductor light emitting device of this invention.

FIG. 14 is a schematic cross-sectional view of a semiconductor light emitting apparatus based on the semiconductor light emitting device of this invention.

The semiconductor light emitting apparatus according to an embodiment of the invention is a white LED in which the semiconductor light emitting device 100 of the first embodiment in FIG. 1 is combined with phosphors.

More specifically, as shown in FIG. 14, a reflection film 23 is provided on the inner surface of a package 22 made of ceramic or the like, and the reflection film 23 is separately provided on the inner side surface and the bottom surface of the package 22. The reflection film 23 is illustratively made of aluminum. The semiconductor light emitting device shown in FIG. 1 is placed via a submount 24 on the reflection film 23 provided at the bottom of the package 22. Gold bumps 25 are formed by a ball bonder on the semiconductor light emitting device and fixed to the submount 24. Alternatively, the semiconductor light emitting device can be directly fixed to the submount 24 without using gold bumps 25.

To fix the semiconductor light emitting device 100 of the first embodiment, the submount 24, and the reflection film 23, bonding with adhesive and soldering can be used. The surface of the submount 24 on the semiconductor light emitting device side is provided with electrodes which are patterned so that the p-side electrode 4 and the n-side electrode 7 of the semiconductor light emitting device are insulated from each other. The electrodes of the submount 24 are connected through bonding wires 26 to electrodes, not shown, provided on the package 22. This connection is formed between the reflection film 23 on the inner side surface and the reflection film 23 on the bottom surface. Furthermore, a first phosphor layer 211 containing red phosphor is formed so as to cover the semiconductor light emitting device and the bonding wires 26. On this phosphor layer is formed a second phosphor layer 212 containing blue, green, or yellow phosphor. A lid 27 made of a silicone resin is provided on this phosphor layer.

The first phosphor layer 211 contains a resin and a red phosphor dispersed in the resin. The red phosphor can be based on a matrix such as $Y_2O_3$, $YVO_4$, and $Y_2(P,V)O_4$, and contains therein trivalent Eu ($Eu^{3+}$) as an activator. That is, $Y_2O_3$:$Eu^{3+}$, $YVO_4$:$Eu^{3+}$ and the like can be used as a red phosphor. The concentration of $Eu^{3+}$ is 1% to 10% in terms of molarity. Besides $Y_2O_3$ and $YVO_4$, the matrix of the red phosphor can be LaOS or $Y_2(P,V)O_4$. Besides $Eu^{3+}$, it is also possible to use $Mn^{4+}$ and the like. In particular, addition of a small amount of Bi in combination with trivalent Eu to the $YVO_4$ matrix increases absorption at 380 nm, and hence the light emission efficiency can be further increased. The resin can be a silicone resin and the like.

The second phosphor layer 212 contains a resin and a blue, green, or yellow phosphor dispersed in the resin. It is possible to use a combination of blue phosphor and green phosphor, a combination of blue phosphor and yellow phosphor, and a combination of blue phosphor, green phosphor, and yellow phosphor. The blue phosphor can be illustratively $(Sr,Ca)_{10}(PO_4)_6Cl_2$: $Eu^{2+}$ or $BaMg_2Al_{16}O_{27}$: $Eu^{2+}$. The green phosphor can be illustratively $Y_2SiO_5$:$Ce^{3+}$,$Tb^{3+}$ with trivalent Tb acting as an emission center. Energy transfer from the Ce ion to the Tb ion enhances excitation efficiency. Alternatively, the green phosphor can be $Sr_4Al_{14}O_{25}$:$Eu^{2+}$. The yellow phosphor can be illustratively $Y_3Al_5$:$Ce^{3+}$. The resin can be a silicone resin and the like. In particular, trivalent Tb exhibits sharp emission around 550 nm where the visibility is maximized. Hence, its combination with the red emission of trivalent Eu significantly enhances light emission efficiency.

In the semiconductor light emitting apparatus of this embodiment, the 380-nm ultraviolet light generated from the semiconductor light emitting device 100 according to the first embodiment is emitted toward the substrate of the semiconductor light emitting device 100. In combination with reflection at the reflection film 23, the above phosphors contained in the phosphor layers can be efficiently excited. For example, the above phosphor contained in the first phosphor layer 211 with trivalent Eu acting as an emission center converts the above light into light with a narrow wavelength distribution around 620 nm, and red visible light can be efficiently obtained. Furthermore, the blue, green, and yellow phosphor contained in the second phosphor layer 212 are efficiently excited, and blue, green, and yellow visible light can be efficiently obtained. As a color mixture of these, white light and light of various other colors can be obtained with high efficiency and good color rendition.

Next, a method for manufacturing a semiconductor light emitting apparatus according to this embodiment is described.

The process for fabricating the semiconductor light emitting device 100 of FIG. 14 is the same as the process of the first embodiment. First, a metal film to serve as a reflection film 23 is formed on the inner surface of the package 22 illustratively by sputtering, and this metal film is patterned to leave the reflection film 23 separately on the inner side surface and the bottom surface of the package 22. Next, gold bumps 25 are formed by a ball bonder on the semiconductor light emitting device 100 fabricated in the first embodiment, and the semiconductor light emitting device 100 is fixed onto a submount 24, which has electrodes patterned for the p-side electrode 4 and the n-side electrode 7. The submount 24 is placed on and fixed to the reflection film 23 on the bottom surface of the package 22. To fix them, bonding with adhesive and soldering can be used. Alternatively, the semiconductor light emitting device 100 can be directly fixed onto the submount 24 without using gold bumps 25 formed by a ball bonder.

Next, the n-side electrode and the p-side electrode, not shown, on the submount 24 are connected through bonding wires 26 to electrodes, not shown, provided on the package 22. Furthermore, a first phosphor layer 211 containing red phosphor is formed so as to cover the semiconductor light emitting device 100 fabricated in the first embodiment and the bonding wires 26. On the first phosphor layer 211 is formed a second phosphor layer 212 containing blue, green, or yellow phosphor. To form each phosphor layer, a raw resin liquid mixture dispersed with the phosphor is dropped, and then subjected to thermal polymerization by heat treatment to cure the resin. If the raw resin liquid mixture containing each phosphor is cured after it is dropped and left standing for a while, fine particles of the phosphor can be precipitated and biased toward the downside of the first and second phosphor layer 211, 212. Thus, the light emission efficiency of each phosphor can be controlled as appropriate. Then, a lid 27 is provided on the phosphor layers. Thus, a while LED according to this embodiment is fabricated.

The embodiments of the invention have been described with reference to the examples. However, the invention is not limited thereto. The shape, size, material, and layout of the elements constituting the semiconductor light emitting device such as the semiconductor multilayer film, metal film, and dielectric film, as well as the crystal growth process, can be variously modified by those skilled in the art without departing from the spirit of the invention, and any such modifications are also encompassed within the scope of the invention.

Furthermore, the components disclosed in the above examples can be combined with each other as long as technically feasible, and such combinations are also encompassed within the scope of the invention. Moreover, some components may be omitted from the entire components shown in each example. Furthermore, components can be suitably combined with each other across different examples.

The "nitride semiconductor" referred to herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those, in the above chemical formula, further containing any group V element other than N (nitrogen), and any of various dopants added for controlling conductivity types.

The invention claimed is:

1. A semiconductor light emitting device comprising:
a first semiconductor layer;
a second semiconductor layer;
a light emitting layer provided between the first semiconductor layer and the second semiconductor layer;
a first electrode provided on the first semiconductor layer;
a second electrode including a first metal film provided on the second semiconductor layer and containing at least one of silver and a silver alloy, and a second metal film provided on the first metal film and made of a metal substantially not containing silver; and
a dielectric film spaced from the first metal film on the second semiconductor layer,
the second metal film covering the first metal film, at least part of the dielectric film, and a surface of the second semiconductor layer exposed between the first metal film and the dielectric film.

2. The device according to claim 1, wherein
a laminated body including the light emitting layer and the second semiconductor layer is formed on a first major surface of the first semiconductor layer, and
the dielectric film covers a side surface of the laminated body.

3. The device according to claim 1, wherein the dielectric film has a smaller thickness in its region covered with the second metal film than in its region not covered with the second metal film on the second semiconductor layer.

4. The device according to claim 1, wherein the second electrode further includes a third metal film provided between the first metal film and the second metal film.

5. The device according to claim 1, wherein the contact resistance between the second metal film and the second semiconductor layer is higher than the contact resistance between the first metal film and the second semiconductor layer.

6. The device according to claim 1, wherein the first metal film is made of a laminated film of silver and platinum.

7. The device according to claim 1, wherein the second electrode further includes a fourth metal film provided between the first metal film and the second metal film and covering at least part of the first metal film.

8. The device according to claim 1, wherein at least part of the second metal film is covered with a pad.

9. A semiconductor light emitting device comprising:
a first semiconductor layer;
a second semiconductor layer;
a light emitting layer provided between the first semiconductor layer and the second semiconductor layer;
a first electrode provided on the first semiconductor layer;
a second electrode including a first metal film provided on the second semiconductor layer and containing at least one of silver and a silver alloy, and a second metal film provided on the first metal film and made of a metal substantially not containing silver; and
a dielectric film spaced from the first metal film on the second semiconductor layer,
the second metal film covering the first metal film, at least part of the dielectric film, and a surface of the second semiconductor layer exposed between the first metal film and the dielectric film,
the dielectric film covering a side surface of a laminated body, the laminated body including the light emitting layer and the second semiconductor layer and being formed on a first major surface of the first semiconductor layer, and
the side surface of the laminated body being oblique to the first major surface.

10. The device according to claim 9, wherein
the dielectric film extends on the first major surface, and
the second metal film extends on the dielectric film covering the side surface of the laminated body and on the dielectric film extending on the first major surface.

11. The device according to claim 9, wherein the second electrode further includes a third metal film provided between the first metal film and the second metal film.

12. The device according to claim 9, wherein the contact resistance between the second metal film and the second semiconductor layer is higher than the contact resistance between the first metal film and the second semiconductor layer.

13. The device according to claim 9, wherein the first metal film is made of a laminated film of silver and platinum.

14. The device according to claim 9, wherein the second electrode further includes a fourth metal film provided between the first metal film and the second metal film and covering at least part of the first metal film.

15. A semiconductor light emitting apparatus comprising:
a semiconductor light emitting device; and
a phosphor configured to absorb light emitted from the semiconductor light emitting device and emit light with a different wavelength,
the semiconductor light emitting device including:
a first semiconductor layer;
a second semiconductor layer;
a light emitting layer provided between the first semiconductor layer and the second semiconductor layer;
a first electrode provided on the first semiconductor layer;
a second electrode including a first metal film provided on the second semiconductor layer and containing at least one of silver and a silver alloy, and a second metal film provided on the first metal film and made of a metal substantially not containing silver; and
a dielectric film spaced from the first metal film on the second semiconductor layer,
the second metal film covering the first metal film, at least part of the dielectric film, and a surface of the second semiconductor layer exposed between the first metal film and the dielectric film.

16. The apparatus according to claim 15, wherein the phosphor is made of a first phosphor containing a red phosphor and a second phosphor containing a blue phosphor and one of a green phosphor and a yellow phosphor.

17. The apparatus according to claim 15, wherein the semiconductor light emitting device is fixed inside a package having an inner surface provided with a reflection film configured to reflect the light.

18. The apparatus according to claim 17, wherein the reflection film is separately provided on an inner side surface and a bottom surface of the package.

19. The apparatus according to claim 18, wherein the semiconductor light emitting device is placed so that an electrode of the semiconductor light emitting device faces the bottom surface of the package, and the electrode is energizably connected to an electrode provided in the separation region of the reflection film.

20. The apparatus according to claim 18, wherein the first phosphor covers the semiconductor light emitting device, the reflection film on the bottom surface, and part of the reflection film on the inner side surface, and the second phosphor is formed on the first phosphor.

* * * * *